June 29, 1965 A. G. MUELLER 3,192,444

MOUNTING MEANS FOR SEMICONDUCTOR DEVICES

Filed Feb. 13, 1963

INVENTOR.
ARMAND G. MUELLER
BY Harold J. Rathbun
William H. Schmelig

United States Patent Office 3,192,444
Patented June 29, 1965

3,192,444

MOUNTING MEANS FOR SEMICONDUCTOR DEVICES

Armand G. Mueller, Wauwatosa, Wis., assignor to Square D Company, Park Ridge, Ill., a corporation of Michigan Filed Feb. 13, 1963, Ser. No. 258,327
4 Claims. (Cl. 317—100)

Figures 1, 2:
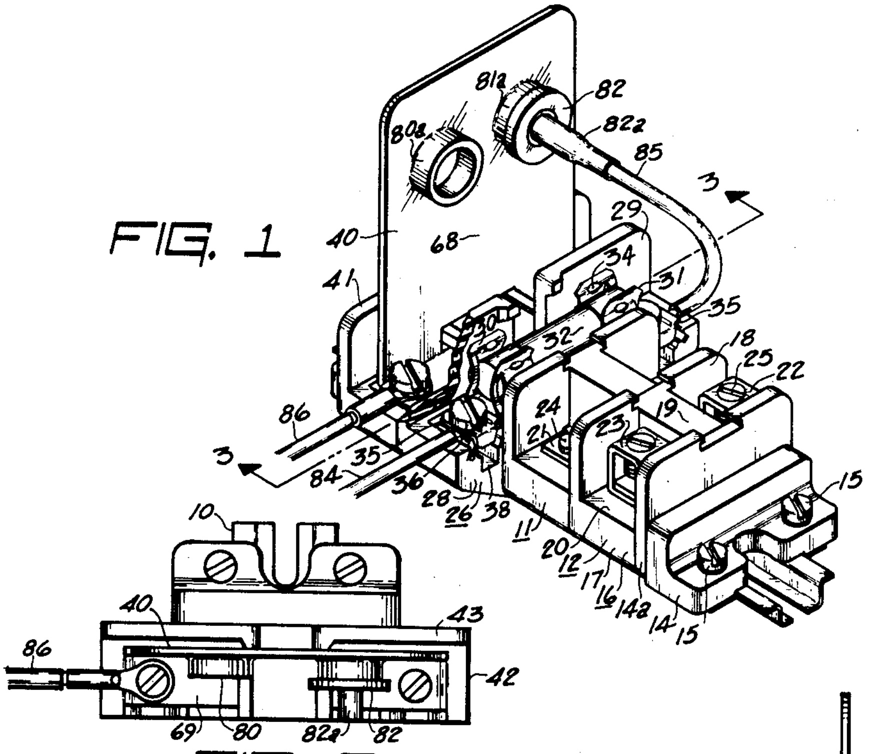

This invention relates to a mounting structure and heat sink for semiconductor devices, and more particularly to a mounting structure and heat sink for transistors, silicon controlled rectifiers, semiconductor diodes, and the like, which facilitates their use for industrial control purposes.

When semiconductor devices are used as components of controllers of an industrial control system, it is desirable to mount the devices on the controller panels together with other components of the control system. This is often difficult to do because semiconductor devices as usually manufactured do not include mounting means suitable for mounting the devices on the metal or insulating panels of such controllers and because semiconductor devices usually must be mounted in thermally-conducting relation to a heat sink. However, terminal strips comprising separable terminal block units and specifically designed for mounting on the panels of such controllers are available. The terminal strips are used to facilitate the electrical connection of the controller to the source and the load, or to other controllers, and to facilitate the making of electrical connections between the components of the controller. The individual terminal block units of a terminal strip are usually aligned in a row and generally each comprises an insulating block carrying a metal connector arranged for interconnecting two wires, but other insulating blocks in the row may be arranged to carry fuse clips, manual disconnect switches, or the like, instead of a metal connector.

In accordance with this invention, there is provided a generally flat, rectangular, metal plate adapted for holding one or more semiconductor devices in good heat conducting relation therewith and arranged to be secured to an insulating mounting block complementary to the terminal block units of a terminal strip thereby to permit the mounting block to be aligned in a row with the terminal block units directly on a controller panel or on a separate mounting structure which, in turn, is mounted on the panel. The plane of the plate is preferably transverse to the longitudinal axis of the row of blocks, and the plate not only serves as a mounting means and a heat sink for the semiconductor devices but also as a convenient means for making electrical connections to the semiconductor devices.

An object of the invention is to provide an improved mounting means for semiconductor devices.

Another object is to provide an improved mounting means and heat sink for semiconductor devices.

Another object is to provide a mounting means and heat sink for semiconductor devices that is complementary to separable terminal block units of a terminal strip for convenient alignment in a row therewith on a controller panel.

Another object is to provide an improved mounting structure for semiconductor devices that facilitates the protection of the devices by fuses.

Other objects and advantages of the invention will become apparent from the following description, wherein reference is made to the drawings, in which:

FIGURE 1 is a perspective view of a preferred form of the mounting structure and heat sink of this invention assembled with a fuse block unit and terminal block units of a terminal strip.

Figure 3:
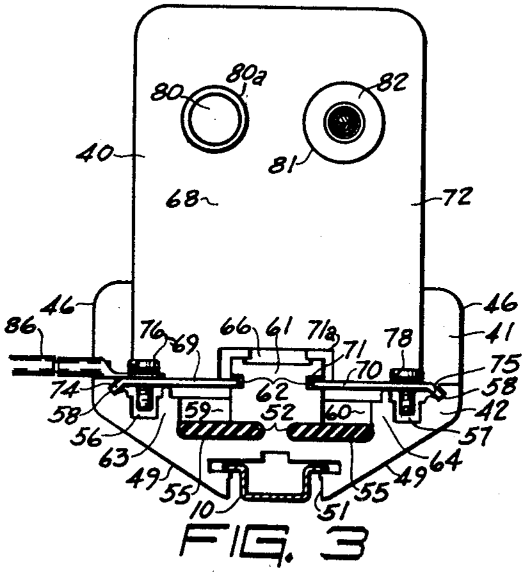
Figure 4:
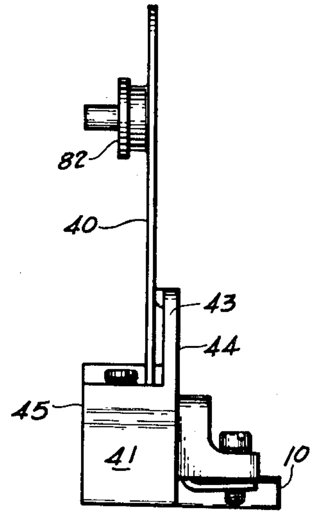

FIGURES 2, 3, and 4 are a top plan, an end, and a side view, respectively, of the mounting structure of FIGURE 1.

The invention is described herein as constructed to be used with the terminal strip described in Van Valkenburg and Nielsen Patent No. 2,981,922, issued April 25, 1961, its adaptation for use with other terminal strips being obvious. As shown in FIGURE 1 and as more fully described in the Van Valkenburg and Nielsen patent, a terminal strip in accordance with the patent comprises an elongated metal channel 10 slidably carrying in a row by dove-tail connections a plurality of terminal block units 11 and 12 loosely interlocked with each other by complementary tongues and slots to be described and gripped from opposite ends between insulating end clamp units, such as the end clamp unit 14, also having dove-tail connections with the channel 10 and fastened to the channel as by screws 15. A separate barrier or reversing block unit 14_a_ interposed between the end clamp unit 14 and the block unit 12 is loosely interlocked with both the clamp unit 14 and the block unit 12 and also has the dove-tail connection with the channel 10. The dove-tail connections are loose enough to permit the unit 11, 12, 14, and 14_a_ to be removed from and replaced on the channel transversely thereof by tilting of the units with respect to the channel 10 when the screws 15 are loosened and the units are moved slightly away from each other along the channel. The channel 10 may be fastened conveniently to any vertical or horizontal surface of a controller.

Each of the terminal block units 11 and 12 comprises a molded insulating block 16 having a base portion 17 with a wall portion 18 extending upwardly therefrom at one end and a central projection 19 extending from the wall portion 18 and overlying in spaced relation an upper face 20 of the base portion 17 to grip the central portion of an elongated flat metal connector 21, in the case of the block unit 11, or the central portion of an elongated metal connector 22 with box-type end portions 23, in the case of the block unit 12. The connectors 21 and 22, respectively, have at opposite ends screw means 24 and 25 for securing wires thereby to complete an electrical connection from one side of the respective projections 19 to the other.

In addition to the terminal block units 11 and 12, the barrier block unit 14_a_ and the end clamp unit 14, the channel 10 is shown in FIGURE 1 as carrying a fuse block unit 26 comprising a base portion 28 with an upstanding wall portion 29 at one end, and a pair of spaced fuse clips 30 and 31 receiving ferrules, respectively, of a cartridge fuse 32. The fuse clips 30 and 31 illustrated are of the type described in the copending patent application of Erik J. Nielsen, Serial No. 751,427, filed July 28, 1958, now abandoned, and assigned to the assignee of the present application. As fully described in the Nielsen application, each of the fuse clips 30 and 31 thus has openings 34 in its jaws, respectively, which restrain the fuse 32 in an upright, disconnected position when moved to that position by swinging one end portion of the fuse 32 upwardly about the other end portion as an axis. Terminal portions 35 of each of fuse clips 30 and 31 receive wire-clamping screws 36, respectively, the lower end portions of which extend freely into suitable recesses 38, respectively, formed in the base portion 28.

As seen most clearly in FIGURES 2, 3, and 4, a semiconductor mounting structure and heat sink unit 40 in accordance with this invention is arranged to be mounted on the channel 10 in the same manner as the other block units, and to this end comprises an insulating block 41 having a body portion 42 with an upstanding wall 43 at one end. The block 41 also has opposite end faces 44 and 45 and opposite side faces 46. A bottom face of the block 41 has downwardly and inwardly sloping face surfaces 49 on opposite sides of a downwardly-opening, generally T-shaped recess 51 complementary to the T-shaped channel 10 but sufficiently larger so that the block 41 can be moved easily longitudinally along the channel and can be removed therefrom or replaced thereon transversely by tilting with respect to the channel. The end face 44 has a pair of spaced-apart horizontally aligned bosses or tongues 52 and the end face 45 has a pair of spaced-apart recesses or slots 55 complementary to the tongues 52. It will be understood that the blocks of the other units 11, 12, and 26 have similar tongues and slots, the barrier unit 14*a* has similar tongues on both end faces, and the clamp unit 14 has similar slots, so that the units, when mounted on the channel 10 in any desired order, can be interlocked with the next adjacent unit or units.

A top face of the block 41 has a pair of recesses 56 and 57 near opposite side edges, respectively, each provided with an angularly-disposed longitudinal groove 58 in its outer wall. Each of a pair of recesses 59 and 60 formed in the top face on opposite sides of a raised central portion 61 has a longitudinal groove 62 in its inner wall horizontally aligned with the entry portions of the grooves 58. The recesses 56 and 59 define a barrier 63 therebetween and the recesses 57 and 60 define a similar barrier 64 therebetween. An upper surface of the projection 61 is provided with a recess 66 to receive an indicia strip.

The semiconductor mounting and heat sink unit 40 also comprises a metal plate 68 preferably formed of aluminum and of generally rectangular configuration having a pair of spaced lower flange portions 69 and 70 interrupted by a notch 71 which has a widened portion 71*a* extending into a main upstanding portion 72 of the plate. Outer end portions 74 and 75 of the flange portions 69 and 70 extend beyond the side edge faces of the portion 72 and are bent downwardly for slidable reception in the grooves 58, respectively. The inner portions of the flanges 69 and 70 extend inwardly from the respective side edges of the widened slot portion 71*a* to permit slidable reception thereof in the grooves 62, respectively. The plate 68 is securely held in an upright position on the block 41 by sliding it from the end face 45 toward the wall portion 43 with the flange portions 69 and 70 received in the grooves 58 and 62 as just described.

The flange portions 69 and 70 may receive wire clamping screws 76 and 78, respectively, to facilitate the making of electrical connections to the plate 68.

A plurality of flanged circular openings such as the openings 80 and 81 are formed in the main portion 72 of the plate 68 as by drawing, for reception, as by a press fit, of the cylindrical metal housings of respective semiconductor devices, such as a device 82 shown mounted in the opening 81. Cylindrical flanges 80*a* and 81*a* of the respective openings 80 and 81 serve to provide an extensive area of contact with the semiconductor devices to provide a good electrical connection and to facilitate transfer of heat from the devices to the plate 68 which thus serves as a heat sink.

Although various modes of completing connections to terminals of the semiconductor devices such as the device 82 are possible, the one shown in FIGURE 1 comprises a wire 84 connected to the terminal portion 35 of the fuse clip 30 from where the circuit is completed through the fuse 32 to the terminal portion 35 of the fuse clip 31, a wire 85 to a terminal 82*a* of the semiconductor device 82, the plate 68, and a wire 86 from the wire clamping screw 76 in the flange portion 69. The fact that a terminal block or a block provided with a knife switch may be positioned adjacent the mounting block 41 on either side along the channel 10 and that connection may be made by either of the screws 76, 78, or both, facilitates the connection of the semiconductor into the circuitry of the controller on which the channel 10 is mounted.

Having thus described my invention, I claim:

1. A mounting structure for semiconductor devices comprising an insulating mounting block having a base portion and a barrier portion extending perpendicular to the base portion, said base portion an end complementary in shape to an end on a base portion of other insulating mounting blocks for assembly therewith in a row to form a strip of blocks for mounting in assembled relation on a controller, a generally flat metal plate secured to the base portion and extending outwardly therefrom in a plane parallel to the barrier portion and transverse to the longitudinal axis of a row of blocks which are assembled with the mounting block to form said strip of blocks, said plate having means for mounting a semiconductor device thereon in good electrical and heat conducting relation thereto, and means for making an electrical connection to said plate.

2. A mounting structure for semiconductor devices comprising an insulating mounting block having an end complementary in shape to an end of other insulating blocks and adapted to be assembled therewith in a row to form a strip of blocks, a generally flat metal plate, said mounting block having a pair of angularly disposed and oppositely extending grooves formed therein and said plate having flange portions slidably received in said pair of grooves to secure said plate to said mounting block, said plate extending outwardly from said mounting block, and having means for mounting a semiconductor device thereon in good heat conducting relation thereto and means for connecting the device in an electric circuit.

3. A mounting structure for semiconductor devices comprising an insulating mounting block having an end complementary in shape to an end of other insulating blocks for being assembled therewith in a row to form a strip of blocks for mounting in assembled relation on a panel, a generally flat metal plate, a plurality of grooves formed in said block and extending perpendicular to the said end of the mounting block, flange portions on said plate received in said grooves, respectively, to secure said plate to said mounting block with said plate extending outwardly therefrom in a plane parallel to said end of the mounting block, said plate having a flanged opening therein for mounting a semiconductor device thereon in good electrical and heat conducting relation thereto, and means for making electrical connections to said plate.

4. A mounting structure for semiconductor devices comprising an insulating block, a generally flat metal plate, a plurality of grooves formed in said block, flange portions on said plate received in said grooves, respectively, thereby to secure said plate to said block with said plate having a portion disposed perpendicular to the flange portions extending outwardly therefrom beyond portions of the periphery of the block, said plate having a flanged opening therein for mounting a semiconductor device in good electrical and heat conducting relation thereto, and a separate means for making electrical connections to said plate.

References Cited by the Examiner

UNITED STATES PATENTS

| | | | |
|---|---|---|---|
| 2,917,286 | 12/59 | Deakin. | |
| 2,935,666 | 5/60 | Van Namen | 174—15 |
| 2,964,688 | 12/60 | McAdam. | |
| 2,981,922 | 4/61 | Van Valkenburg et al. | 339—113 X |
| 2,994,203 | 8/61 | Lackey et al. | 174—15 |
| 3,047,648 | 7/62 | Mowatt | 174—16 |

FOREIGN PATENTS

| | | |
|---|---|---|
| 357,171 | 9/31 | Great Britain. |

OTHER REFERENCES

"Snap-on Terminal Blocks," Electrical Construction and Maintenance, July 1961, page 120.

DARRELL L. CLAY, *Primary Examiner.*

JOHN P. WILDMAN, E. JAMES SAX, *Examiners.*